(12) United States Patent
Chang et al.

(10) Patent No.: US 10,170,523 B2
(45) Date of Patent: Jan. 1, 2019

(54) TOUCH SENSITIVE DISPLAY AND METHOD FOR MANUFACTURING THE SAME

(75) Inventors: Heng-Yao Chang, Taoyuan (TW); Chen-Yu Liu, Jhongli (TW)

(73) Assignee: TPK Touch Solutions Inc., Taipei (TW)

( * ) Notice: Subject to any disclaimer, the term of this patent is extended or adjusted under 35 U.S.C. 154(b) by 311 days.

(21) Appl. No.: 13/220,706

(22) Filed: Aug. 30, 2011

(65) Prior Publication Data

US 2012/0235928 A1   Sep. 20, 2012

(30) Foreign Application Priority Data

Mar. 17, 2011  (CN) .......................... 2011 1 0064715

(51) Int. Cl.
*G06F 3/044* (2006.01)
*H01L 27/32* (2006.01)

(52) U.S. Cl.
CPC ............ *H01L 27/323* (2013.01); *G06F 3/044* (2013.01); *G06F 2203/04103* (2013.01)

(58) Field of Classification Search
CPC .......... G09G 3/22; G09G 3/3208; G09G 3/30; G09G 3/3225; G09G 3/3233; G09G 3/3241; G09G 3/3266; G09G 3/3275; G09G 3/3258
USPC ......................................... 345/156, 173–179
See application file for complete search history.

(56) References Cited

U.S. PATENT DOCUMENTS

| 7,612,860 | B2 * | 11/2009 | Kim et al. .................... 349/158 |
| 8,289,481 | B2 * | 10/2012 | Tashiro et al. ................ 349/110 |
| 8,493,345 | B2 * | 7/2013 | Anno ............................ 345/173 |
| 8,928,601 | B2 * | 1/2015 | Lee .......................... G06F 3/041 178/18.03 |
| 8,952,903 | B2 * | 2/2015 | Ho .......................... G06F 3/044 178/18.01 |
| 2005/0117093 | A1 * | 6/2005 | Kim et al. ..................... 349/106 |
| 2005/0129841 | A1 * | 6/2005 | McCormick et al. .......... 427/66 |
| 2007/0108899 | A1 * | 5/2007 | Jung et al. ..................... 313/506 |
| 2007/0242055 | A1 * | 10/2007 | Lai ........................ G06F 3/0412 345/173 |
| 2008/0030646 | A1 * | 2/2008 | Go ..................... G02F 1/133608 349/62 |
| 2008/0232047 | A1 * | 9/2008 | Yamada .............. G02F 1/13452 361/679.02 |
| 2009/0090694 | A1 * | 4/2009 | Hotelling ................ G06F 3/044 216/41 |
| 2010/0045912 | A1 * | 2/2010 | Chen et al. .................... 349/122 |
| 2010/0110041 | A1 * | 5/2010 | Jang ............................. 345/174 |

(Continued)

FOREIGN PATENT DOCUMENTS

TW     M37127     12/2009

*Primary Examiner* — William Lu
(74) *Attorney, Agent, or Firm* — Cooper Legal Group, LLC

(57) ABSTRACT

The present invention relates to a touch sensitive display, which includes an upper substrate with a mask layer placed thereon, a touch sensing layer, a lower substrate, and an organic light-emitting assembly. The touch sensing layer is disposed below the upper substrate, and the lower substrate is disposed by facing with the upper substrate. The organic light-emitting assembly is disposed above the lower substrate with facing to the touch sensing layer. Furthermore, a method for manufacturing the touch sensitive display is provided.

20 Claims, 3 Drawing Sheets

(56) References Cited

U.S. PATENT DOCUMENTS

| | | | |
|---|---|---|---|
| 2010/0141608 A1* | 6/2010 | Huang | G06F 3/044 |
| | | | 345/178 |
| 2010/0164881 A1* | 7/2010 | Kuo | G06F 3/044 |
| | | | 345/173 |
| 2010/0182554 A1* | 7/2010 | Shim et al. | 349/122 |
| 2010/0201640 A1* | 8/2010 | Nozawa et al. | 345/173 |
| 2010/0244005 A1* | 9/2010 | Gyoda | H01L 51/5237 |
| | | | 257/40 |
| 2011/0050604 A1* | 3/2011 | Kwon et al. | 345/173 |
| 2011/0090158 A1* | 4/2011 | Omori | G06F 3/0412 |
| | | | 345/173 |
| 2011/0141034 A1* | 6/2011 | Lai et al. | 345/173 |
| 2011/0159773 A1* | 6/2011 | Jung et al. | 445/25 |
| 2011/0267297 A1* | 11/2011 | Yamazaki et al. | 345/173 |

* cited by examiner

TOUCH SENSITIVE DISPLAY AND METHOD FOR MANUFACTURING THE SAME

BACKGROUND OF THE INVENTION

This Application claims the benefit of the People's Republic of China Application No. 201110064715.X, filed Mar. 17, 2011.

Field of the Invention

The present invention relates to a display device, and especially relates to an organic light-emitting display integrating with touch technology.

Description of the Related Art

Flat panel displays and touch panels are widely used and accepted by consumers to replace traditional video output devices, such as Cathode Ray Tube (CRT) display, and physical input devices, such as a keyboard and mouse, respectively.

Currently, flat panel displays use Liquid Crystal Display (LCD) as a main choice, but several problems exist in that. Recently, more manufactures are spending more time and effort toward the research and development of Organic Light-Emitting Display (OLED). An OLED comprises an organic-material coating layer and a glass substrate. There is no need for a backlight source in the design structure of the OLED due to the organic-material coating layer that radiates lights by itself when the electric current passes through. Thereby, OLEDs compared to LCDs have many advantages, such as smaller in size, larger in viewable angle, and capable of bending.

FIG. 1 shows a schematic diagram of a cross-sectional view of a traditional touch sensitive display based on the conventional technology of combining an OLED and a touch panel. A touch sensitive display 9 comprises an OLED 92 and a touch panel 91 directly laminated on the OLED 92. The touch panel 91, such as a capacitive-type touch panel, comprises a touch sensitive layer 911, a touch substrate 913 for bearing the touch sensitive layer 911, and a cover substrate 912 for protecting the touch panel 91 from wearing off. Additionally, a mask layer 914 is formed on the peripheral area of the cover substrate 912 to cover metal lines (not shown) of the touch sensitive layer 911 for prettifying the exterior of the touch panel 91.

The OLED 92 comprises a lower substrate 922, an organic light-emitting assembly 923 stacked on the lower substrate 922, and an upper substrate 921 disposed on the organic light-emitting assembly 923. A sealing layer 924 is for sealing the elements inside the OLED 92 into one assembly, and the touch panel 91 is disposed on the upper substrate 921 of the OLED 92 by a lamination way, thereby forming a complete structure of the touch sensitive display 9.

From the above description, a whole volume and thickness of the touch sensitive display would be increased due to the touch panel and the OLED are separate entities. Moreover, it would require a complicated manufacturing process due to the need to produce the touch panel and the OLED separately and then laminate the touch panel and the OLED together. Thus, it is desired to provide an improved touch sensitive display that solves the above drawbacks of the traditional touch sensitive display.

SUMMARY OF THE INVENTION

Accordingly, the present invention provides a touch sensitive display with an embedded touch structure and a method for manufacturing the same to achieve the purpose of lightening the touch sensitive display and simplifying the manufacturing process for the touch sensitive display.

In one aspect, a touch sensitive display is provided including an upper substrate with a mask layer placed thereon, a touch sensing layer, a lower substrate, and an organic light-emitting assembly. The touch sensing layer is disposed below the upper substrate, and the lower substrate is disposed by facing with the upper substrate. The organic light-emitting assembly is disposed above the lower substrate with facing to the touch sensing layer.

In another aspect, a method for manufacturing the touch sensitive display is provided including forming a mask layer on a peripheral area of an upper substrate, forming an organic light-emitting assembly above a lower substrate, forming a touch sensing layer below the upper substrate having the mask layer, and assembling the upper substrate and the lower substrate so as to dispose the touch sensing layer and the organic light-emitting assembly for facing each other.

DETAILED DESCRIPTION

The detailed description of the present invention will be discussed in the following embodiments, which are not intended to limit the scope of the present invention, but still can be adapted for other applications. While drawings are illustrated in detail, it is appreciated that the quantity of the disclosed components would be greater or less than that is disclosed, except the components expressly restricting amount.

Terms such as "above"/"below", "top"/"bottom" and "upper"/"lower" in this specification are used to represent relative directions. With respect to the figures accompanying this description, tops and bottoms of the depicted touch sensitive display appear nearer to and further from the viewer respectively.

The present invention is designed to integrate a touch sensing layer in organic light emitting display (abbreviated as OLED) to form a slim and thin touch sensitive display which has capabilities of video output and touch input functions. The classification of the OLED, according to driving manners, includes an active matrix (named AM-OLED) and a passive matrix (named PM-OLED), and the pixel patterns in the OLED also could be made by different layout structures based on practical designs, but those designs could be used in but not limit the present invention.

Figure 1:
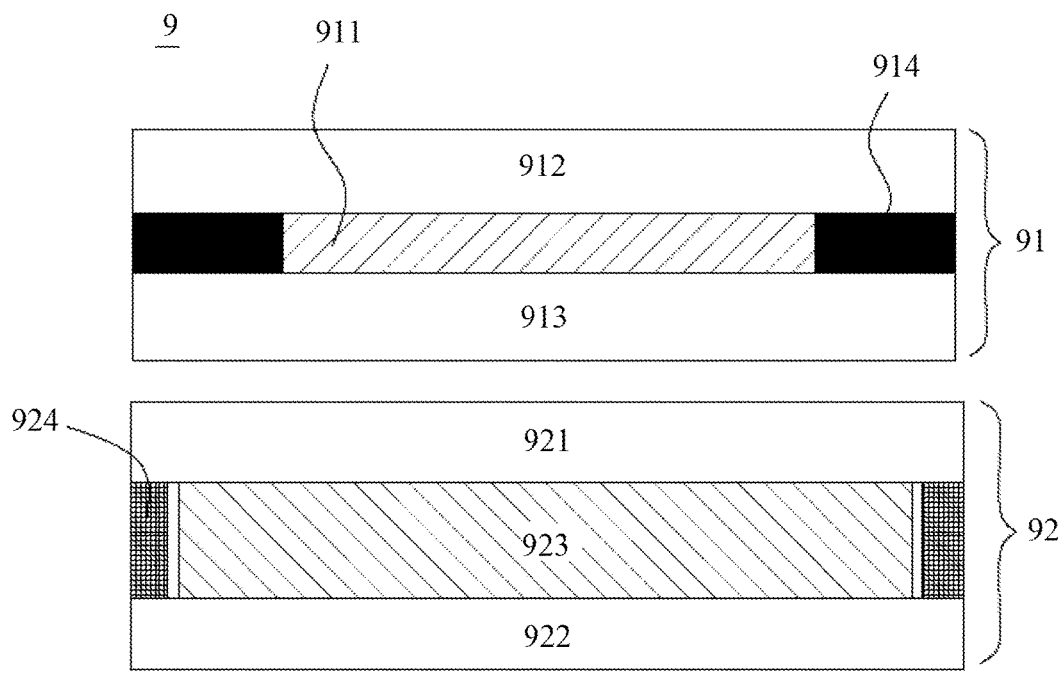
FIG. 1 is a schematic cross-sectional view of a traditional touch sensitive display.
Figure 2:
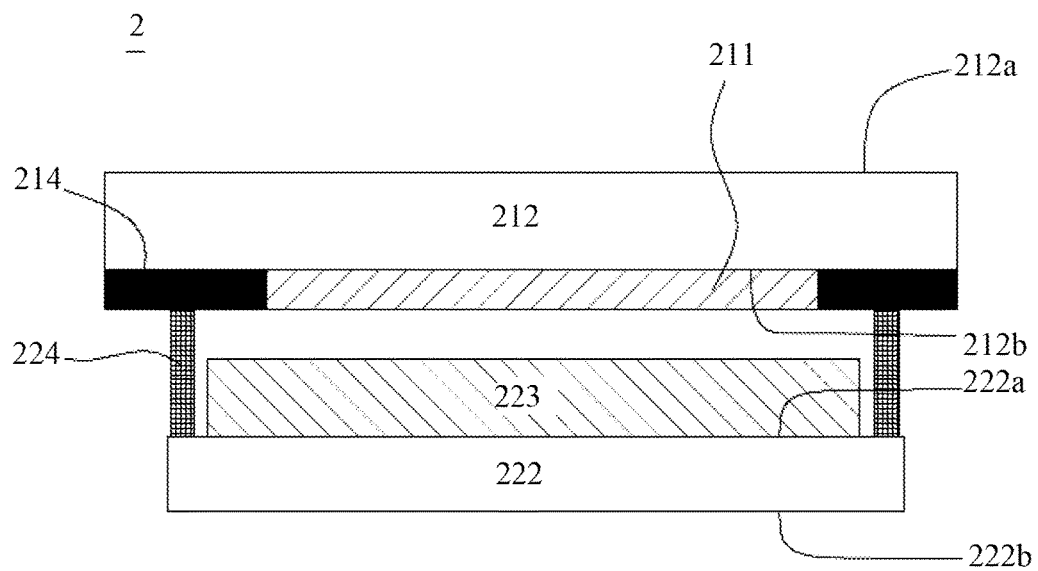
FIG. 2 is a schematic cross-sectional view of a touch sensitive display according to an embodiment of the present invention.

FIG. 2 is a schematic cross-sectional view of a touch sensitive display according to an embodiment of the present invention. As shown in FIG. 2, the touch sensitive display 2 includes an upper substrate 212, a lower substrate 222, a touch sensing layer 211, and an organic light-emitting assembly 223. The upper substrate 212 has a mask layer 214 placed thereon. The mask layer 214 is formed on the peripheral area of the upper substrate 212. The upper substrate 212 and the lower substrate 222 are disposed by face to face to bear the touch sensing layer 211 and the organic light-emitting assembly 223, respectively. More particularly, the upper substrate 212 with the mask layer 214 placed thereon has a top surface 212a and a bottom surface 212b, and the lower substrate 222 has a top surface 222a and a bottom surface 222b, wherein the bottom surface 212b of the upper substrate 212 and the top surface 222a of the lower substrate 222 are disposed by face to face. Besides, the material chosen for the upper substrate 212 and the lower substrate 222 may be glass, plastic, or the like. The material chosen for the mask layer 214 may be opaque and/or light-blocked material.

The organic light-emitting assembly 223 is disposed above the lower substrate 222. Moreover, the organic light-emitting assembly 223 is disposed on the top surface 222a of the lower substrate 222 with facing to the touch sensing layer 211. In the present embodiment, the organic light-emitting assembly 223 may at least comprise a Thin Film Transistor (TFT) element, a pixel electrode layer, a light emission layer, and a counter electrode layer. The material of the pixel electrode layer may adopt a transparent conductive material such as Indium Tin Oxide (ITO), the light emission layer may irradiate white light, RGB light, or blue light based on different material chosen for the light emission layer, and the counter electrode layer may be made by metal electrodes such as silver electrodes, magnesium electrodes, or calcium electrodes. For simplifying the figures, those elements contained in the organic light-emitting assembly 223 are not shown in the figures, but may be integrally formed on the lower substrate 222, and more particularly, may be integrally formed on the top surface 222a of the lower substrate 222.

Figure 3A:
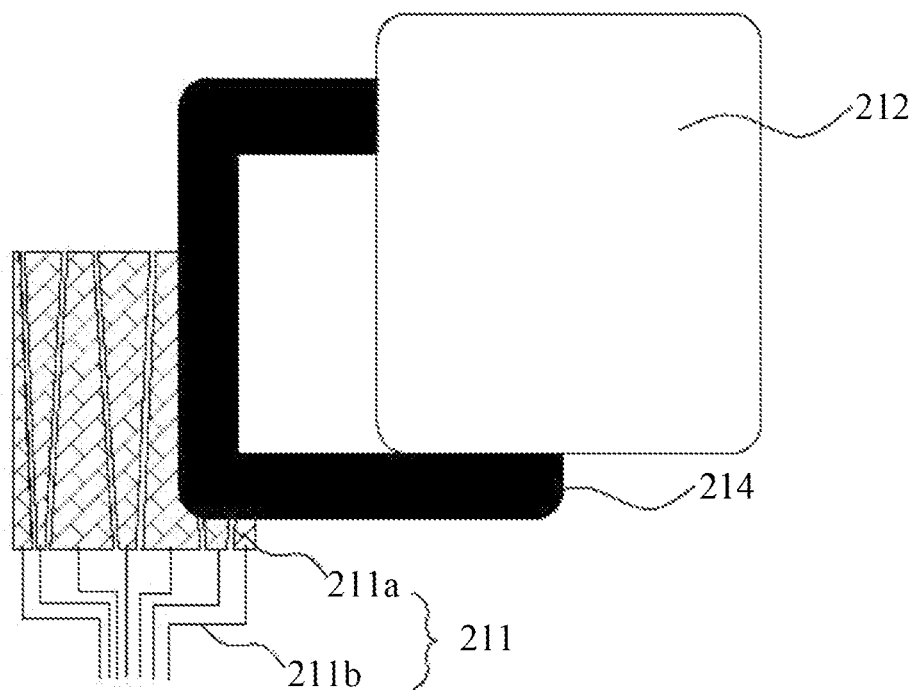
FIG. 3A and FIG. 3B are schematic diagrams of an enlarged view and a schematic top view of a structure of an upper substrate and a touch sensing layer, respectively.
Figure 3B:
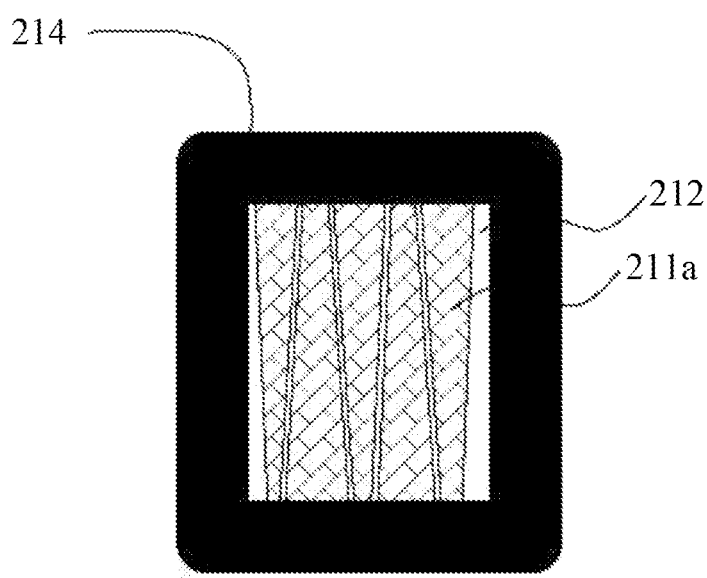

The touch sensing layer 211 is disposed below the upper substrate 212, particularly, the touch sensing layer 211 is disposed on the bottom surface 212b of the upper substrate 212 with facing to the organic light-emitting assembly 223. FIG. 3A and FIG. 3B are schematic diagrams of enlarged views and a schematic top view of a structure of an upper substrate and a touch sensing layer, respectively. As shown in FIG. 3A, the touch sensing layer 211 comprises a plurality of sensing electrodes 211a placed on the same level of the upper substrate 212 to be as a single-layer structure (but the present invention is not limited to such a single-layer structure), the single-layer structure also has a plurality of signal transmission lines 211b connected to the sensing electrodes 211a. Those signal transmission lines 211b usually may be formed by metal material and therefore need to be disposed below the mask layer 214 because the mask layer 214 is made of opaque and light-blocked material and may cover the signal transmission lines 211b from notifying. As shown in FIG. 3B, the viewer may not notice the signal transmission lines 211b from the above of touch sensitive display 2, thereby the mask layer 214 is formed to prettify the exterior of the touch sensitive display 2.

The touch sensitive display 2 of the present embodiment further comprises a sealing layer, which is formed between the upper substrate 212 and the lower substrate 222 for sticking the upper substrate 212 and the lower substrate 222 into one assembly.

Figure 4:
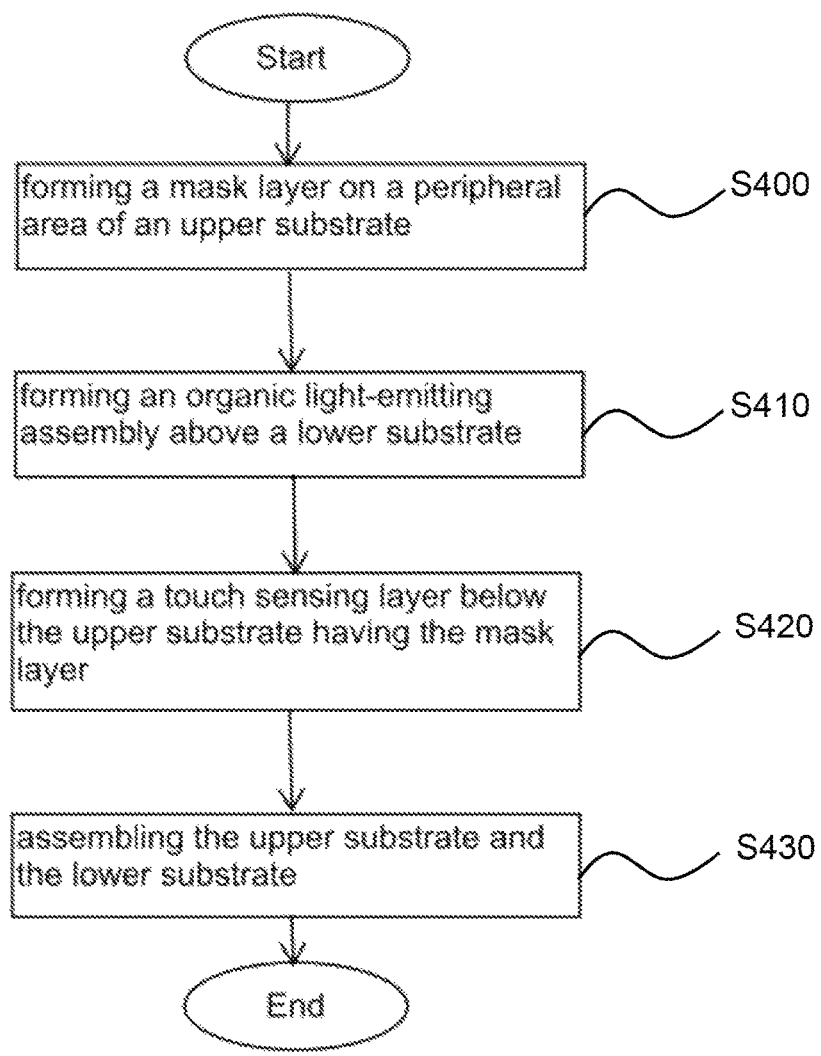
FIG. 4 is a schematic flow chart of a method for manufacturing a touch sensitive display according to another embodiment of the present invention.

FIG. 4 is a schematic flow chart of a method for manufacturing a touch sensitive display according to another embodiment of the present invention. The method for manufacturing the touch sensitive display comprises the steps of forming a mask layer on a peripheral area of an upper substrate at step S400, forming an organic light-emitting assembly above a lower substrate at step S410, forming a touch sensing layer below the upper substrate having the mask layer at step S420, and assembling the upper substrate and the lower substrate so as to dispose the touch sensing layer and the organic light-emitting assembly by face to face at step S430.

Specifically, the upper substrate has a top surface and a bottom surface, and the lower substrate has a top surface and a bottom surface. Therefore, step S410 is further defined by forming the organic light-emitting assembly on the top surface of the lower substrate, step S420 is further defined by forming the touch sensing layer on the bottom surface of the upper substrate, and step S430 is further defined by disposing the bottom surface of the upper substrate and the top surface of the lower substrate by face to face.

In other embodiment, the organic light-emitting assembly may at least comprise a TFT element, a pixel electrode layer, a light emission layer, and a counter electrode layer. These elements contained in the organic light-emitting assembly may be integrally formed above the lower substrate at step S410, specifically speaking, may be integrally formed on the top surface of the lower substrate.

Specifically at step S430, the assembling way is by forming a sealing layer between the upper substrate and the lower substrate for sticking the upper substrate and the lower substrate into one assembly.

Other detail on the material of the components and the composition of the structure are disclosed in the previous embodiment, and hereby not described again.

As described above the present invention embeds or integrates the touch sensing layer into the OLED so as to a singular upper substrate with a mask layer is utilized to replace three substrates (including a upper substrate of the OLED 92, as well as a touch substrate and a cover substrate of the touch panel 91) of the traditional touch sensitive display. Such that the touch sensitive display of the present invention may have a slim and thin structure to achieve the lightening purpose, besides, the manufacturing process and the composition for the touch sensitive display may be simplified for reducing the productive cost.

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A touch sensitive display, comprising:
   an upper substrate;
   a lower substrate that has a top surface facing a bottom surface of the upper substrate;
   a touch sensing layer disposed on the bottom surface of the upper substrate wherein the touch sensing layer comprises a plurality of sensing electrodes and a plurality of signal transmission lines connected to the plurality of sensing electrodes;
   a mask layer disposed in a peripheral area on the bottom surface of the upper substrate, wherein:
      the plurality of sensing electrodes is surrounded by the mask layer, and
      the plurality of sensing electrodes and the mask layer intersect a plane parallel to a plane in which the top surface of the lower substrate lies;
   an organic light-emitting assembly disposed on the top surface of the lower substrate; and a sealing layer disposed between the mask layer and the lower substrate and sealing together the upper substrate and the lower substrate.

2. The touch sensitive display according to claim 1, wherein the organic light-emitting assembly at least comprises a thin film transistor (TFT) element, a pixel electrode layer, a light emission layer, and a counter electrode layer, which are integrally formed on the lower substrate.

3. The touch sensitive display according to claim 1, wherein the mask layer is made by at least one of opaque or light-blocked material.

4. The touch sensitive display according to claim 1, wherein the plurality of sensing electrodes is formed as single-layer.

5. The touch sensitive display according to claim 1, wherein the plurality of signal transmission lines is formed by a metal material.

6. The touch sensitive display according to claim 5, wherein the plurality of signal transmission lines are disposed below the mask layer.

7. The touch sensitive display according to claim 1, wherein:
the mask layer contacts the bottom surface of the upper substrate, and
the touch sensing layer contacts the bottom surface of the upper substrate.

8. The touch sensitive display according to claim 7, wherein a sidewall of the mask layer contacts a sidewall of the touch sensing layer.

9. The touch sensitive display according to claim 8, wherein a bottom surface of the mask layer is co-planar with a bottom surface of the plurality of sensing electrodes.

10. The touch sensitive display according to claim 1, wherein a sidewall of the mask layer contacts a sidewall of the touch sensing layer.

11. The touch sensitive display according to claim 10, wherein a bottom surface of the mask layer is co-planar with a bottom surface of the plurality of sensing electrodes.

12. The touch sensitive display according to claim 1, wherein a bottom surface of the mask layer is co-planar with a bottom surface of the plurality of sensing electrodes.

13. The touch sensitive display according to claim 1, wherein the touch sensing layer is separated from the organic light-emitting assembly by a first distance.

14. The touch sensitive display according to claim 1, wherein the sealing layer is in contact with the mask layer and the lower substrate.

15. A method for manufacturing a touch sensitive display comprising:
forming a mask layer on a peripheral area of a bottom surface of an upper substrate, wherein the mask layer contacts the bottom surface of the upper substrate;
forming an organic light-emitting assembly on a top surface of a lower substrate;
forming a touch sensing layer on the bottom surface of the upper substrate wherein the touch sensing layer comprises a plurality of sensing electrodes and a plurality of signal transmission lines connected to the plurality of sensing electrodes, wherein;
the plurality of sensing electrodes is surrounded by the mask layer, and
the plurality of sensing electrodes and the mask layer intersect a plane parallel to a plane in which the top surface of the lower substrate lies; and
forming a sealing layer between the mask layer and the lower substrate that seals together the upper substrate and the lower substrate, wherein the top surface of the lower substrate faces the bottom surface of the upper substrate.

16. The method according to claim 15, wherein;
the organic light-emitting assembly at least comprises a thin film transistor (TFT) element, a pixel electrode layer, a light emission layer, and a counter electrode layer, and
the method further comprises integrally forming the TFT, the pixel electrode layer, the light emission layer, and the counter electrode layer on the lower substrate.

17. The method according to claim 15, wherein the mask layer is made by opaque or light-blocked material.

18. The method according to claim 15, wherein the a plurality of sensing electrodes is formed as single-layer.

19. The method according to claim 15, wherein the plurality of signal transmission lines is formed by a metal material.

20. The method according to claim 19, wherein the plurality of signal transmission lines are disposed below the mask layer.

* * * * *